(12) United States Patent
Yoshihara et al.

(10) Patent No.: US 8,691,336 B2
(45) Date of Patent: Apr. 8, 2014

(54) COATING TREATMENT METHOD, NON-TRANSITORY COMPUTER STORAGE MEDIUM AND COATING TREATMENT APPARATUS

(75) Inventors: Kousuke Yoshihara, Koshi (JP); Katsunori Ichino, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 161 days.

(21) Appl. No.: 13/069,522

(22) Filed: Mar. 23, 2011

(65) Prior Publication Data

US 2011/0250765 A1    Oct. 13, 2011

(30) Foreign Application Priority Data

Apr. 8, 2010 (JP) .................................. 2010-089155
Feb. 9, 2011 (JP) ................................. 2011-025967

(51) Int. Cl.
*B05D 3/12* (2006.01)
*G06F 19/00* (2011.01)

(52) U.S. Cl.
USPC ........ 427/240; 427/425; 427/427.3; 700/121; 118/52; 118/320; 118/321; 118/323; 438/780; 438/782

(58) Field of Classification Search
USPC ......... 427/240, 425, 427.3; 118/52, 320, 321; 118/323; 438/780, 782; 700/121
See application file for complete search history.

(56) References Cited

U.S. PATENT DOCUMENTS

| | | | | |
|---|---|---|---|---|
| 5,672,205 A | * | 9/1997 | Fujimoto et al. | 211/13.1 |
| 5,837,319 A | * | 11/1998 | Walters et al. | 427/240 |
| 5,976,620 A | * | 11/1999 | Sanada et al. | 427/240 |
| 7,820,243 B2 | | 10/2010 | Yoshihara et al. | |
| 2007/0092643 A1 | * | 4/2007 | Yoshihara et al. | 427/240 |
| 2008/0176410 A1 | * | 7/2008 | Muramatsu et al. | 438/758 |
| 2009/0087559 A1 | * | 4/2009 | Yoshihara et al. | 427/240 |
| 2009/0285984 A1 | * | 11/2009 | Kitano et al. | 427/240 |
| 2010/0209607 A1 | * | 8/2010 | Takayanagi et al. | 427/240 |
| 2011/0005459 A1 | | 1/2011 | Yoshihara et al. | |

FOREIGN PATENT DOCUMENTS

| | | |
|---|---|---|
| JP | 2000-150357 A | 5/2000 |
| JP | A-2007-115936 | 5/2007 |
| JP | 2008-253986 A | 10/2008 |
| JP | 2009-078250 A | 4/2009 |

* cited by examiner

*Primary Examiner* — Kristen Jolley
(74) *Attorney, Agent, or Firm* — Posz Law Group, PLC

(57) ABSTRACT

A coating treatment method includes: a first step of discharging a coating solution from a nozzle to a central portion of a substrate while acceleratingly rotating the substrate, to apply the coating solution over the substrate; a second step of then decelerating the rotation of the substrate and continuously rotating the substrate; and a third step of then accelerating the rotation of the substrate to dry the coating solution on the substrate. In the first step, the acceleration of the rotation of the substrate is changed in the order of a first acceleration, a second acceleration higher than the first acceleration, and a third acceleration lower than the second acceleration to acceleratingly rotate the substrate at all times.

4 Claims, 11 Drawing Sheets

COATING TREATMENT METHOD, NON-TRANSITORY COMPUTER STORAGE MEDIUM AND COATING TREATMENT APPARATUS

BACKGROUND OF THE INVENTION

1. Field of the Invention

The present disclosure relates to a coating treatment method of applying a coating solution onto a substrate, a non-transitory computer storage medium and a coating treatment apparatus.

2. Description of the Related Art

For example, in a photolithography process in manufacturing processes of a semiconductor device, resist coating treatment for forming a resist film by applying a resist solution onto, for example, a wafer, exposure processing for exposing the resist film to a predetermined pattern, developing treatment for developing the exposed resist film and so on are sequentially performed, whereby a predetermined resist pattern is formed on the wafer.

In the aforesaid resist coating treatment, often used is a so-called spin coating method of applying a resist solution over the surface of the wafer by supplying the resist solution from a nozzle to the central portion of the wafer rotated at a high speed and diffusing the resist solution on the wafer by a centrifugal force. In this spin coating method, proposed as the method of uniformly applying the resist solution is, for example, a method of supplying the resist solution to the wafer rotated at a high speed, then once decelerating the rotation of the wafer to flatten the resist solution on the wafer, and then increasing the rotation of the wafer to dry the resist solution on the wafer (Japanese Patent Application Laid-open No. 2007-115936).

SUMMARY OF THE INVENTION

However, the resist film is increasingly thinned in the resist coating treatment with further miniaturization of the circuits of the semiconductor devices. Further, the resist solution is expensive, and the amount used needs to be reduced as much as possible. From the point of views, reduction of the supply amount of the resist solution to the wafer is under consideration. However, in this case, when the resist solution is supplied to the center of the wafer rotated at a high speed as in the prior art, the resist solution is rapidly diffused outward from the center of the wafer and thereby sometimes forms streak-shaped coating mottles near the center of the wafer. Once such coating mottles are generated, for example, defocusing occurs in exposure processing, finally failing to form a resist pattern with a desired dimension on the wafer.

The present disclosure has been made in consideration of the points, and an object thereof is to apply, in a case where a coating solution such as a resist solution is applied to a substrate such as a wafer using a spin-coating method, the coating solution uniformly within the substrate even if the coating amount of the coating solution is small.

To achieve the above object, the present disclosure is a coating treatment method of a substrate, including: a first step of discharging a coating solution from a nozzle to a central portion of a substrate while acceleratingly rotating the substrate, to apply the coating solution over the substrate; a second step of then decelerating the rotation of the substrate and continuously rotating the substrate; and a third step of then accelerating the rotation of the substrate to dry the coating solution on the substrate, wherein in the first step, an acceleration of the rotation of the substrate is changed in an order of a first acceleration, a second acceleration higher than the first acceleration, and a third acceleration lower than the second acceleration to acceleratingly rotate the substrate at all times.

According to the present disclosure, since the substrate is acceleratingly rotated at all times in the first step, the substrate is rotated at a relatively low speed at the start of the first step and then rotated at a relatively high speed at the end of the first step. As described above, since the rotation speed of the substrate is low immediately after the coating solution is discharged to the central portion of the substrate, a strong centrifugal force is not applied to the coating solution on the substrate. In addition, since the acceleration of the rotation of the substrate in this event is the first acceleration lower than the second acceleration, the centrifugal force applied to the coating solution on the substrate is suppressed. Therefore, the coating solution is evenly diffused outward. Thereafter, the substrate is acceleratingly rotated at the second acceleration higher than the first acceleration, so that the coating solution on the substrate is smoothly and rapidly diffused. Thereafter, the substrate is acceleratingly rotated at the third acceleration lower than the second acceleration, so that the amount of the coating solution scattering to the outside of the substrate can be suppressed to a minute amount while the coating solution reached the outer peripheral portion of the substrate is smoothly diffused. In addition, since the substrate is acceleratingly rotated at all times in the first step, the coating solution can be rapidly diffused, and the coating amount for diffusing the coating solution over the entire surface of the substrate can be suppressed to a small amount. Consequently, according to the present disclosure, even when the coating amount of the coating solution is small, the coating solution can be uniformly applied. This makes it possible to form on the substrate a coating film thinner than that in the prior art. Further, the cost required for the coating treatment can also be reduced.

The third acceleration may be higher than the first acceleration.

The coating treatment method may further include, before the first step, a fourth step of discharging a solvent for the coating solution to the substrate to apply the solvent over the substrate while rotating the substrate, wherein after the fourth step and before the first step, the rotation of the substrate may be decelerated, and wherein the first step may be started at a rotation speed lower than a rotation speed of the substrate in the fourth step.

The coating treatment method may further include, before the first step, a fourth step of supplying a solvent for the coating solution to the substrate to apply the solvent over the substrate while rotating the substrate, wherein the first step may be started with a rotation speed of the substrate in the fourth step maintained.

The discharge of the coating solution by the nozzle in the first step may be continuously performed until a middle of the second step.

In the second step, after the discharge of the coating solution is performed until the middle of the second step and the discharge of the coating solution is stopped, the rotation of the substrate may be decelerated and the substrate may be continuously rotated.

When the discharge of the coating solution by the nozzle in the second step is ended, a discharge position of the coating solution may be displaced from the central portion of the substrate by movement of the nozzle.

The movement of the nozzle may be started concurrently with an end of the first step. Note that "concurrently" stated here includes substantially concurrently within 0.5 seconds before or after the end of the first step.

The present disclosure according to another aspect is a non-transitory computer-readable storage medium storing a program running on a computer of a control unit controlling a coating treatment apparatus to cause the coating treatment apparatus to perform a coating treatment method, the coating treatment method including: a first step of discharging a coating solution from a nozzle to a central portion of a substrate while acceleratingly rotating the substrate, to apply the coating solution over the substrate; a second step of then decelerating the rotation of the substrate and continuously rotating the substrate; and a third step of then accelerating the rotation of the substrate to dry the coating solution on the substrate, wherein in the first step, an acceleration of the rotation of the substrate is changed in an order of a first acceleration, a second acceleration higher than the first acceleration, and a third acceleration lower than the second acceleration to acceleratingly rotate the substrate at all times.

The present disclosure according to still another aspect is a coating treatment apparatus of a substrate, including: a rotating and holding unit holding and rotating a substrate thereon; a nozzle discharging a coating solution to the substrate; and a control unit controlling operations of the rotating and holding unit and the nozzle to perform a first step of discharging the coating solution from the nozzle to a central portion of the substrate while acceleratingly rotating the substrate by the rotating and holding unit, to apply the coating solution over the substrate; a second step of then decelerating the rotation of the substrate and continuously rotating the substrate; and a third step of then accelerating the rotation of the substrate to dry the coating solution on the substrate, wherein in the first step, an acceleration of the rotation of the substrate is changed in an order of a first acceleration, a second acceleration higher than the first acceleration, and a third acceleration lower than the second acceleration to acceleratingly rotate the substrate at all times.

According to the present disclosure, in a case where a coating solution is applied to a substrate using a spin-coating method, the coating solution can be uniformly applied within the substrate even if the coating amount of the coating solution is small.

DETAILED DESCRIPTION OF THE INVENTION

Figure 1:
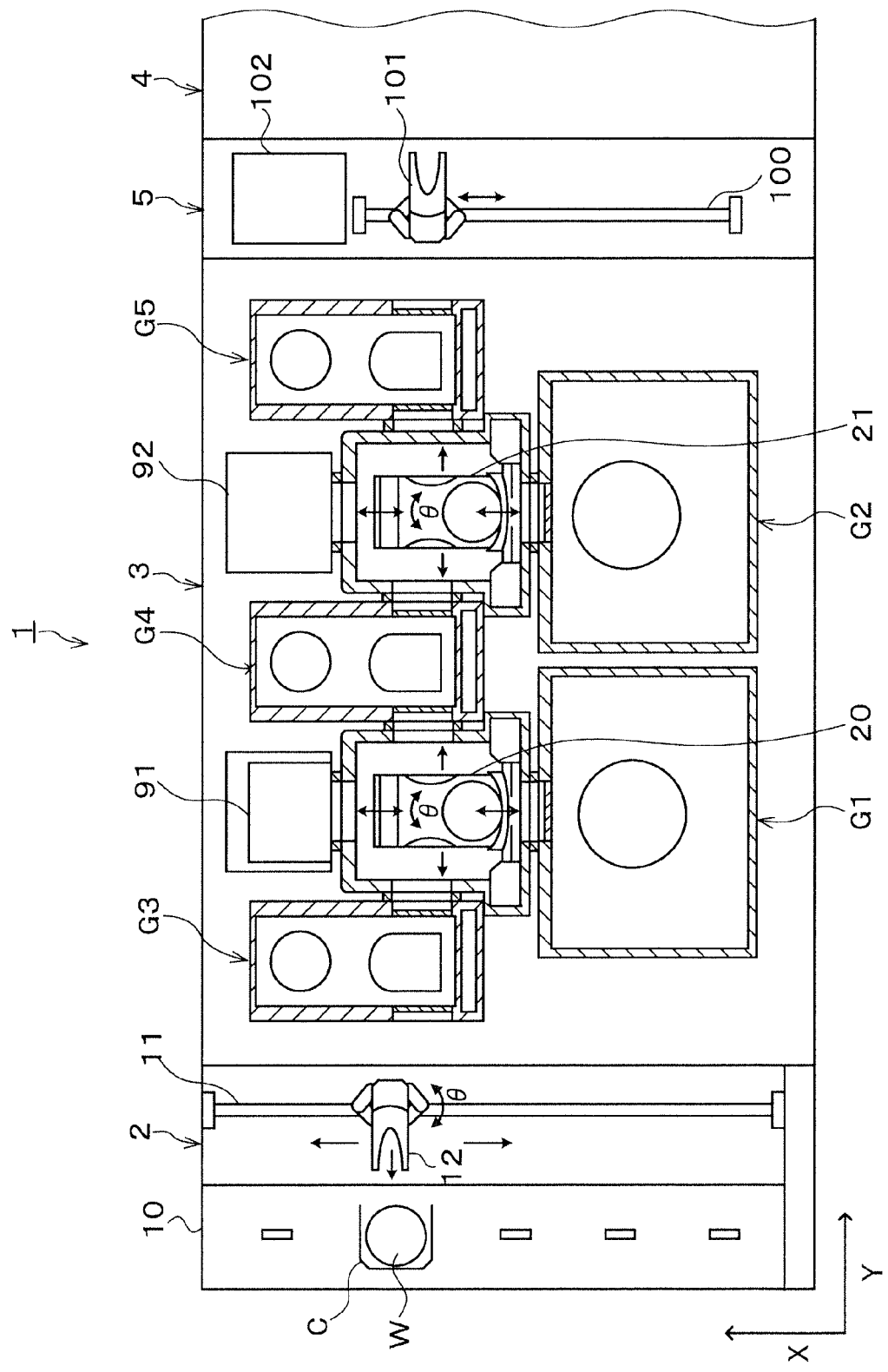
FIG. 1 is a plan view schematically showing the configuration of a coating and developing treatment system in which a coating treatment unit according to this embodiment is installed.
Figure 2:
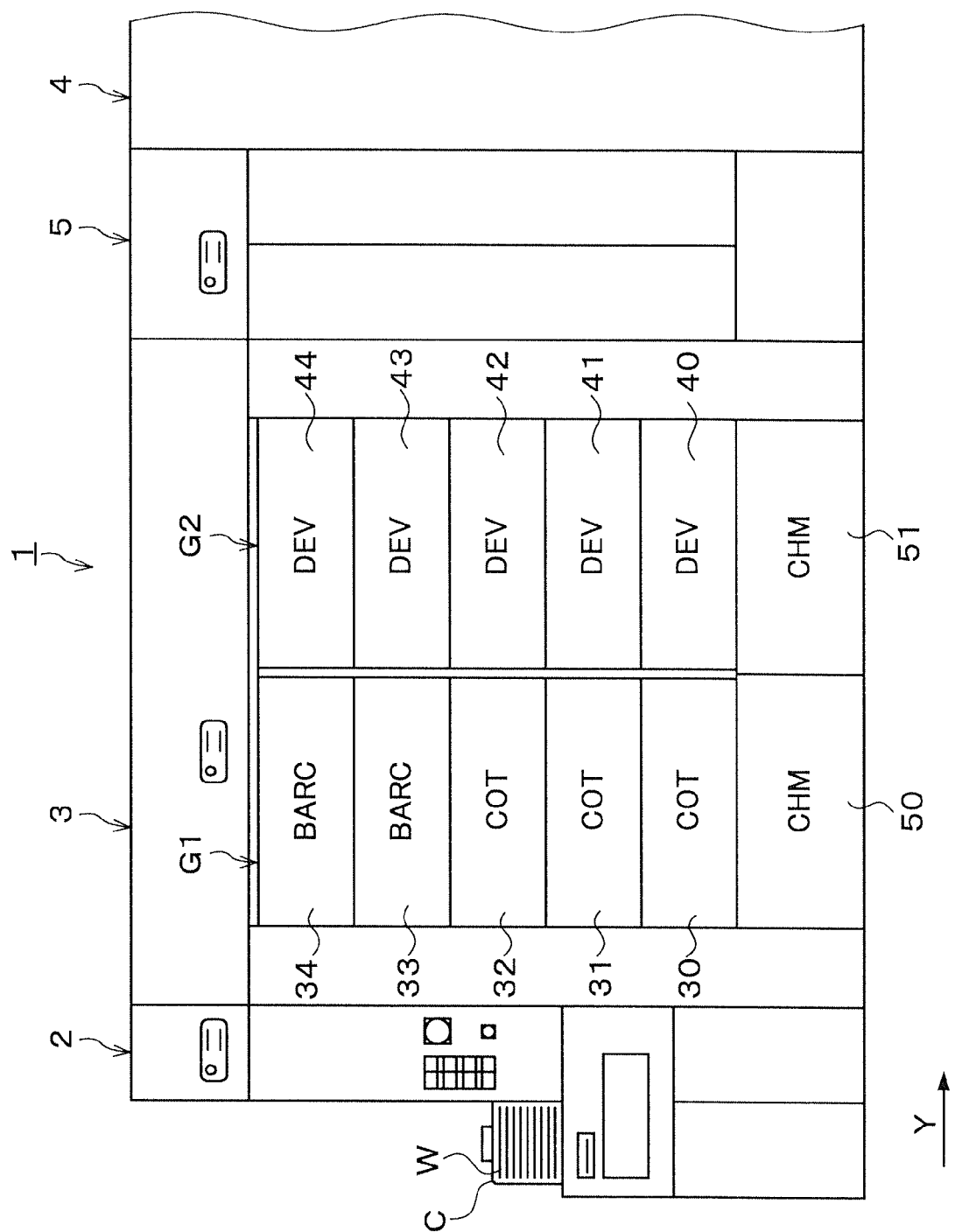
FIG. 2 is a front view of the coating and developing treatment system according to this embodiment.
Figure 3:
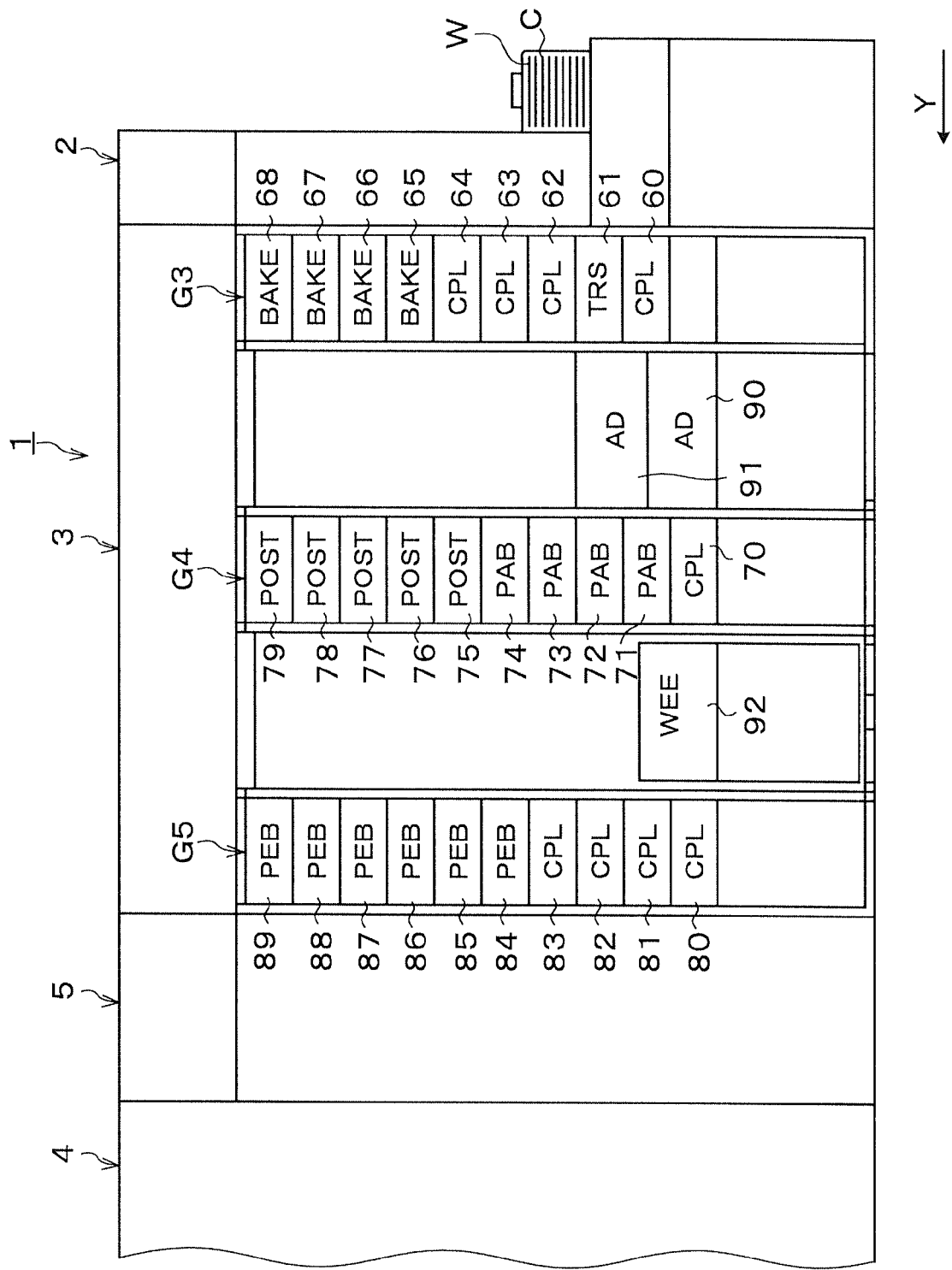
FIG. 3 is a rear view of the coating and developing treatment system according to this embodiment.

Hereinafter, embodiments of the present disclosure will be described. FIG. 1 is a plan view schematically showing the configuration of a coating and developing treatment system 1 in which a coating treatment apparatus according to this embodiment is installed. FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring a plurality of wafers W per cassette as a unit from/to the outside into/from the coating and developing treatment system 1; a processing station 3 including a plurality of various kinds of processing and treatment units for performing predetermined processing or treatment in a manner of single wafer processing in a photolithography process; and an interface station 5 for passing the wafer W to/from an aligner 4 adjacent to the processing station 3, are integrally connected.

In the cassette station 2, a cassette mounting table 10 is provided and configured such that a plurality of cassettes C can be mounted on the cassette mounting table 10 in a line in an X-direction (a top-bottom direction in FIG. 1). In the cassette station 2, a wafer transfer unit 12 is provided which is movable in the X-direction on a transfer path 11. The wafer transfer unit 12 is also movable in the arrangement direction of the wafers W housed in the cassette C (a Z-direction; the vertical direction), and thus can selectively access the plurality of wafers W in the cassette C. Further, the wafer transfer unit 12 is rotatable around the axis in the vertical direction (a θ-direction), and thus can access the processing and treatment units included in a later-described third processing unit group G3 in the processing station 3 and transfer the wafer W to them.

The processing station 3 includes, for example, five processing unit groups G1 to G5 in each of which a plurality of processing and treatment units are multi-tiered. On an X-direction negative direction (a downward direction in FIG. 1) side in the processing station 3, the first processing unit group G1 and the second processing unit group G2 are placed in order from the cassette station 2 side toward the interface station 5 side. On an X-direction positive direction (an upward direction in FIG. 1) side in the processing station 3, the third processing unit group G3, the fourth processing unit group G4, and the fifth processing unit group G5 are placed in order from the cassette station 2 side toward the interface station 5 side. Between the third processing unit group G3 and the fourth processing unit group G4, a first transfer unit 20 is provided. The first transfer unit 20 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 21 is provided. The second transfer unit 21 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 30, 31, and 32 as the coating treatment apparatuses according to this embodiment, and bottom coating units 33 and 34 each for forming an anti-reflection film that prevents reflection of light at the time of exposure processing, are five-tiered in order from the bottom. In the second processing unit group G2, solution treatment units, for example, developing treatment units 40 to 44 each for supplying a developing solution to the wafer W to develop it are five-tiered in order from the bottom. Further, chemical chambers 50 and 51 each for supplying various kinds of treatment solutions to the solution treatment units in the processing unit groups G1 and G2 are provided on the lowermost tiers of the first processing unit group G1 and the second processing unit group G2, respectively.

As shown in FIG. 3, in the third processing unit group G3, a temperature regulating unit 60 performing temperature regulation of the wafer W by mounting the wafer W on a temperature regulation plate, a transition unit 61 delivering the wafer W, temperature regulating units 62 to 64, and heating processing units 65 to 68 each for performing heating processing on the wafer W are nine-tiered in order from the bottom.

In the fourth processing unit group G4, for example, a temperature regulating unit 70, pre-baking units 71 to 74 each for performing heating processing on the wafer W after the resist coating treatment, and post-baking units 75 to 79 each for performing heating processing on the wafer W after the developing treatment, are ten-tiered in order from the bottom.

In the fifth processing unit group G5, a plurality of thermal processing units each for performing thermal processing on the wafer W, for example, temperature regulating units 80 to 83 and post-exposure baking units 84 to 89 each for performing heating processing on the wafer W after exposure are ten-tiered in order from the bottom.

As shown in FIG. 1, a plurality of treatment units are arranged on the X-direction positive direction side of the first transfer unit 20, and adhesion units 90 and 91 each for performing hydrophobic treatment on the wafer W are two-tiered in order from the bottom as shown in FIG. 3. As shown in FIG. 1, on the X-direction positive direction side of the second transfer unit 21, for example, an edge exposure unit 92 is disposed which selectively exposes only the edge portion of the wafer W to light.

In the interface station 5, for example, a wafer transfer unit 101 moving on a transfer path 100 extending in the X-direction and a buffer cassette 102 are provided as shown in FIG. 1. The wafer transfer unit 101 is movable in the Z-direction and also rotatable in the O-direction and thus can access the aligner 4 adjacent to the interface station 5, the buffer cassette 102, and the processing and treatment units in the fifth processing unit group G5 and transfer the wafer W to them.

Note that the aligner 4 in this embodiment performs, for example, liquid-immersion exposure and can expose, with a liquid film of liquid, for example, pure water staying on the surface of the wafer W, the resist film on the surface of the wafer W with the pure water intervening therebetween.

Figure 4:
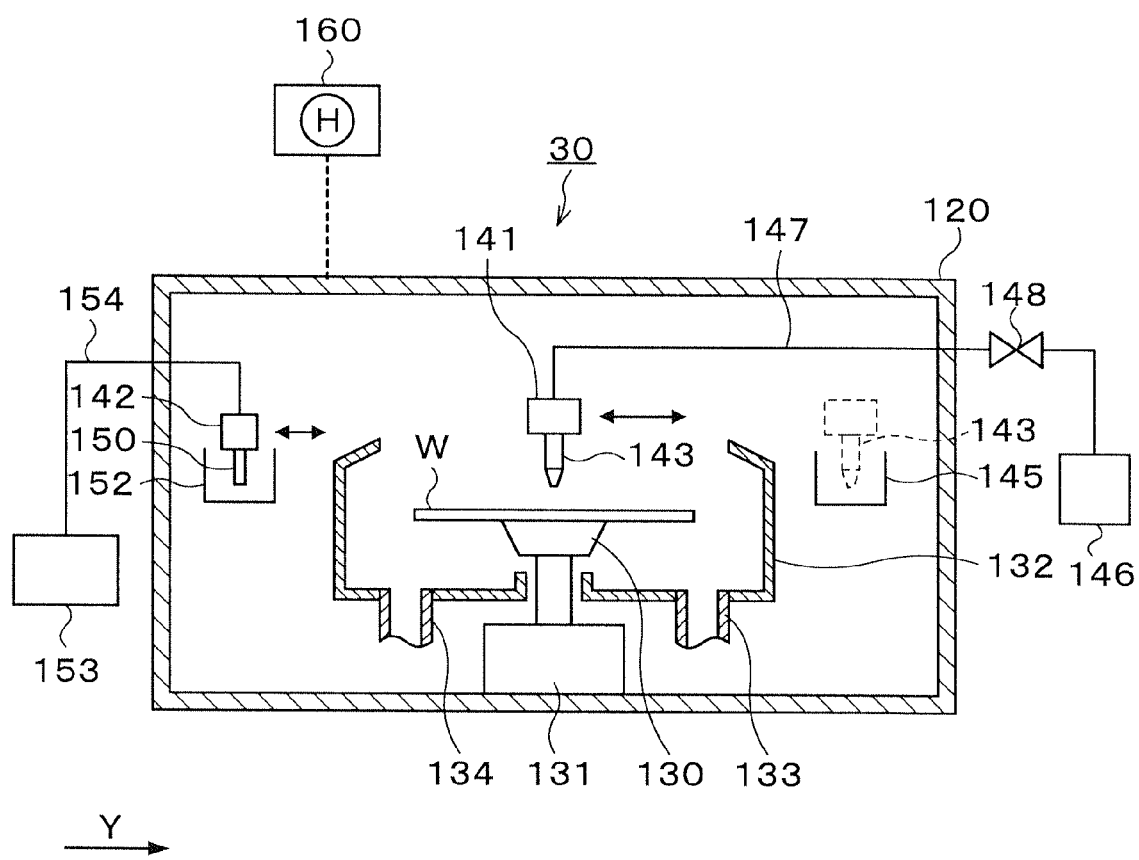
FIG. 4 is a longitudinal sectional view schematically showing the configuration of the resist coating unit.
Figure 5:
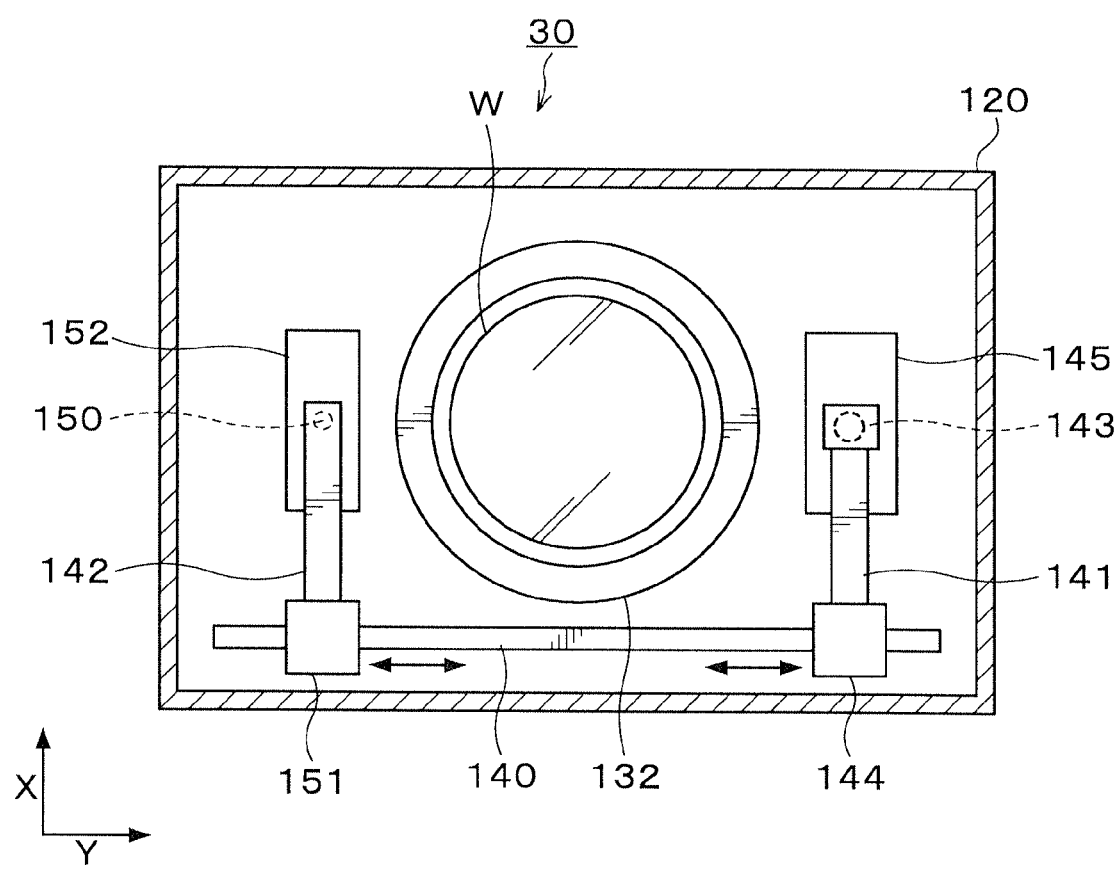
FIG. 5 is a transverse sectional view schematically showing the configuration of the resist coating unit.

Next, the configurations of the above-described resist coating units 30 to 32 will be described. FIG. 4 is an explanatory view of a longitudinal section schematically showing the configuration of the resist coating unit 30, and FIG. 5 is an explanatory view of a transverse section schematically showing the configuration of the resist coating unit 30.

The resist coating unit 30 has, for example, a casing 120 as shown in FIG. 4, and at a central portion in the treatment container 120, a spin chuck 130 as a rotating and holding unit for holding and rotating the wafer W thereon is provided. The spin chuck 130 has a horizontal upper surface, and the upper surface is provided with, for example, a suction port (not shown) through which the wafer W is sucked. The suction through the suction port allows the wafer W to be suction-held on the spin chuck 130.

The spin chuck 130 has a chuck drive mechanism 131 equipped with, for example, a motor or the like and can rotate at a predetermined speed by means of the chuck drive mechanism 131. Further, the chuck drive mechanism 131 is provided with a raising and lowering drive source such as a cylinder so that the spin chuck 130 can move up and down. Note that the rotation speed of the spin chuck 130 is controlled by a later-described control unit 160.

Around the spin chuck 130, a cup 132 is provided which receives and collects liquid splashing or dropping from the wafer W. A drain pipe 133 for draining the collected liquid and an exhaust pipe 134 for exhausting the atmosphere in the cup 132 are connected to the bottom surface of the cup 132.

As shown in FIG. 5, on an X-direction negative direction (a downward direction in FIG. 5) side of the cup 132, a rail 140 is formed which extends in a Y-direction (a right-left direction in FIG. 5). The rail 140 is formed, for example, from a Y-direction negative direction (a left direction in FIG. 5) side outer position of the cup 132 to a Y-direction positive direction (a right direction in FIG. 5) side outer position. To the rail 140, for example, two arms 141, 142 are attached.

On the first arm 141, a first nozzle 143 for discharging a resist solution as a coating solution is supported as shown in FIG. 4 and FIG. 5. The first arm 141 is movable on the rail 140 by means of a nozzle drive unit 144 shown in FIG. 5. This allows the first nozzle 143 to move from a waiting section 145 provided at the Y-direction positive direction side outer position of the cup 132 to a position above a central portion of the wafer W in the cup 132 and further move in a direction of the diameter of the wafer W above the front surface of the wafer W. Further, the first arm 141 can freely move up and down by means of the nozzle drive unit 144 to be able to adjust the height of the first nozzle 143. Note that the above-described first arm 141 and nozzle drive unit 144 constitute a "nozzle moving mechanism" in this embodiment.

To the first nozzle 143, a supply pipe 147 communicating with a resist solution supply source 146 is connected as illustrated in FIG. 4. In the resist solution supply source 146 in this embodiment, for example, a resist solution with a low viscosity for forming a thin resist film, for example, a resist film of 150 nm or less is stored. Further, the supply pipe 147 is provided with a valve 148 so that discharge of the resist solution can be turned ON/OFF by the opening/closing of the valve 148.

On the second arm 142, a second nozzle 150 for discharging the solvent for resist solution, for example, a thinner is supported. The second arm 142 is movable on the rail 140, for example, by means of a nozzle drive unit 151 shown in FIG. 5 and can move the second nozzle 150 from a waiting section 152 provided at the Y-direction negative direction side outer position of the cup 132 to a position above a central portion of the wafer W in the cup 132. Further, the second arm 142 can freely move up and down by means of the nozzle drive unit 151 to be able to adjust the height of the second nozzle 150.

To the second nozzle 150, a supply pipe 154 communicating with a solvent supply source 153 is connected as shown in FIG. 4. Note that the first nozzle 143 discharging the resist solution and the second nozzle 150 discharging the solvent are supported on the separate arms in the above configuration, but may be supported on the same arm so that the movements and the discharge timings of the first nozzle 143 and the second nozzle 150 may be controlled by controlling the movement of the arm.

The above-described operations of the driving system such as the rotational operation of the spin chuck 130, the moving operation of the first nozzle 143 by the nozzle drive unit 144, the ON/OFF operation of discharge of the resist solution of the first nozzle 143 by the valve 148, the moving operation of the second nozzle 150 by the nozzle drive unit 151 and so on are controlled by the control unit 160. The control unit 160 is composed of a computer equipped with, for example, a CPU and a memory, and can realize the resist coating treatment in the resist coating unit 30 by executing programs, for example, stored in the memory. Note that various programs used for implementing the resist coating treatment in the resist coating unit 30 are ones that are stored, for example, in a storage medium H such as a computer-readable CD and installed from the storage medium H into the control unit 160.

Note that the configurations of the resist coating units 31 and 32 are the same as that of the above-described resist coating unit 30, and therefore description will be omitted.

Next, a coating treatment process performed in the resist coating unit 30 configured as described above will be described together with a process of the wafer processing performed in the whole coating and developing treatment system 1.

First of all, unprocessed wafers W are taken out of the cassette C on the cassette mounting table 10 one by one by the wafer transfer unit 12 shown in FIG. 1 and sequentially transferred to the processing station 3. The wafer W is transferred to the temperature regulating unit 60 included in the third processing unit group G3 of the processing station 3 and temperature-regulated to a predetermined temperature. Thereafter, the wafer W is transferred by the first transfer unit 20, for example, to the bottom coating unit 34, where an anti-reflection film is formed. The wafer W is then transferred by the first transfer unit 20, for example, to the heating processing unit 65 and the temperature regulating unit 70 in sequence, and subjected to predetermined processing in each of the units. The wafer W is then transferred by the first transfer unit 20, for example, to the resist coating unit 30.

Figure 6:
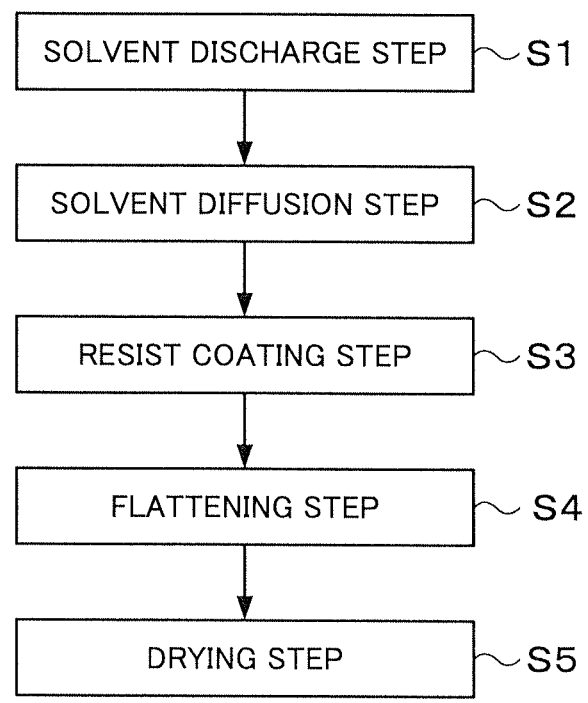
FIG. 6 is a flowchart showing main steps of a resist coating treatment.
Figure 7:
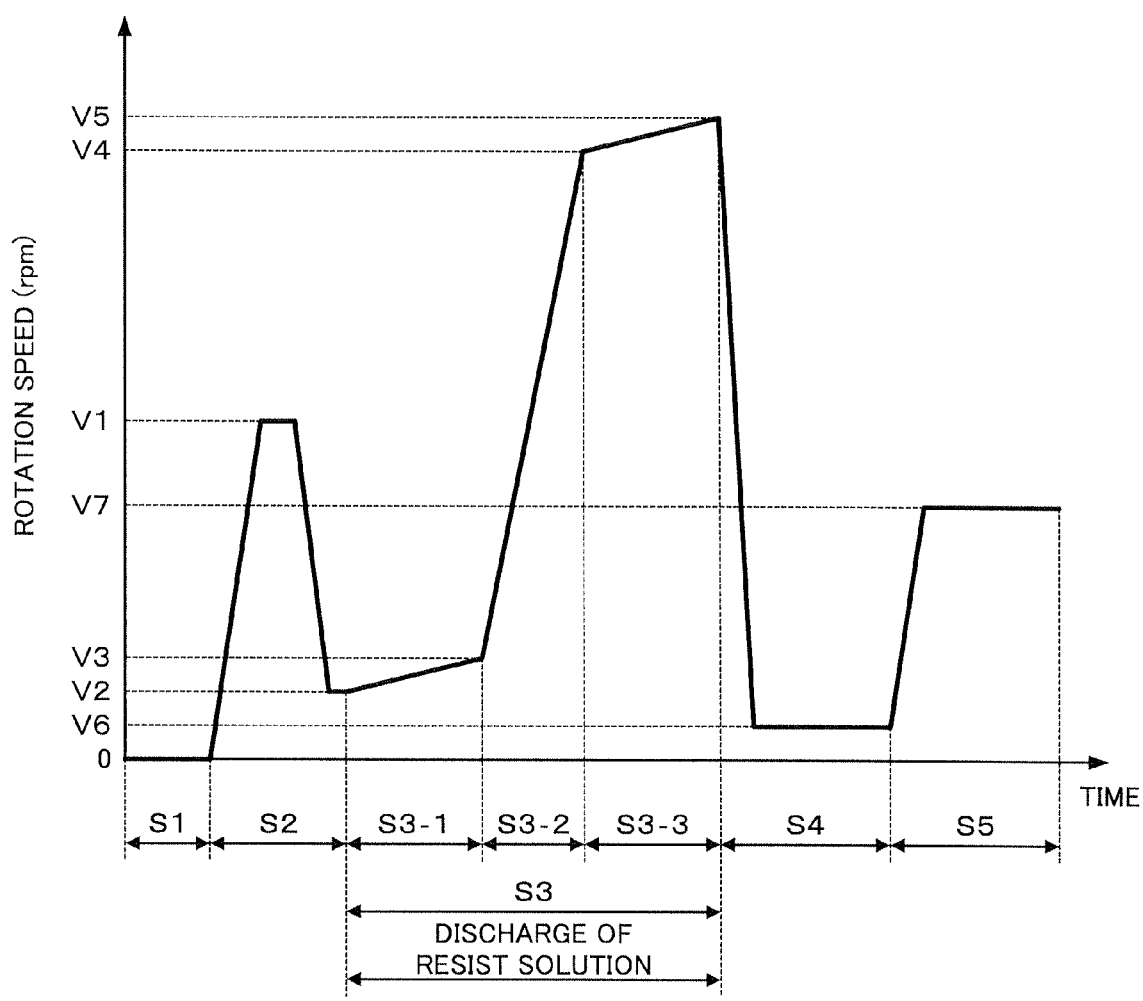
FIG. 7 is a graph showing the rotation speed of the wafer and the discharge timing of the resist solution in each of the steps of the resist coating treatment.

FIG. 6 is a flowchart showing main steps of the coating treatment process in the resist coating unit 30. FIG. 7 is a graph showing the rotation speed of the wafer W and the discharge timing of the resist solution in each of the steps of this coating treatment process. Note that the time length of process in FIG. 7 does not always correspond to the actual time length for easy understanding of the technique.

First of all, after transferred into the resist coating unit 30, the wafer W is suction-held on the spin chuck 130 as shown in FIG. 4. Subsequently, the second nozzle 150 at the waiting section 152 is moved by the second arm 142 to a position above the central portion of the wafer W. Then, for example, while the wafer W is kept stopped, a predetermined amount of solvent is discharged from the second nozzle 150 and supplied to the central portion of the wafer W (a solvent discharge step S1 in FIG. 6 and FIG. 7). Thereafter, the wafer W is rotated by the spin chuck 130 at a first speed V1, for example, of about 2000 rpm as shown in FIG. 7, whereby the solvent on the wafer W is diffused over the entire surface of the wafer W and applied over the surface of the wafer W (a solvent diffusion step S2 in FIG. 6 and FIG. 7). In this event, for example, the first nozzle 143 at the waiting section 145 is moved by the first arm 141 to a position above the central portion of the wafer W. Note that in this embodiment, the solvent discharge step S1 and the solvent diffusion step S2 constitute a fourth step in the present disclosure.

Once the solvent is applied over the surface of the wafer W, the rotation of the wafer W is decelerated to a second speed V2, for example, of about 300 rpm lower than the first speed V1.

Subsequently, the valve 148 is opened, and the discharge of the resist solution from the first nozzle 143 is started as shown in FIG. 7, whereby the resist solution is started to be supplied to the central portion of the wafer W. Thus, a coating step S3 of the resist solution (a first step in the present disclosure) is started.

In the coating step S3, the rotation of the wafer W is first accelerated from the second speed V2 to a third speed V3, for example, of about 500 rpm (a step S3-1 in FIG. 7). In this step S3-1, the acceleration of the rotation of the wafer is a first acceleration, for example, of 500 rpm/s or lower, more preferably, 100 rpm/s. Since the rotation speed of the wafer W is low immediately after the resist solution is discharged to the central portion of the wafer W as described above, strong centrifugal force is not applied to the resist solution on the wafer W. In addition, since the first acceleration of the rotation of the wafer W in this event is also low, the centrifugal force applied to the resist solution on the wafer W is suppressed. Therefore, the resist solution is diffused outward evenly.

Subsequently, the rotation of the wafer W is accelerated from the third speed V3 to a fourth speed, for example, of about 3800 rpm (a step S3-2 in FIG. 7). In this step S3-2, the acceleration of the rotation of the wafer is a second acceleration, for example, of 5000 rpm/s to 30000 rpm/s, more preferably, 10000 rpm/s higher than the first acceleration. Since the wafer W is acceleratingly rotated at the second acceleration higher than the first acceleration as described above, the resist solution on the wafer W is smoothly and rapidly diffused.

Subsequently, the rotation of the wafer W is accelerated from the fourth speed V4 to a fifth speed V5, for example, of about 4000 rpm (a step S3-3 in FIG. 7). In this step S3-3, the acceleration of the rotation of the wafer is a third acceleration, for example, of 500 rpm/s or lower, more preferably, 100 rpm/s lower than the second acceleration. Since the substrate is acceleratingly rotated at the third acceleration lower than the second acceleration as described above, the amount of the coating solution scattering to the outside of the substrate can be suppressed to a minute amount while the coating solution reached the outer peripheral portion of the substrate is smoothly diffused.

As described above, in the coating step S3, the acceleration of the rotation of the wafer W is varied in the order of the first acceleration, the second acceleration and the third acceleration, and the wafer W is acceleratingly rotated at all times. Further, in the coating step S3, the resist solution is kept supplied to the central portion of the wafer W. This diffuses the supplied resist solution over the entire surface of the wafer W by the centrifugal force and thereby applies the resist solution over the surface of the wafer W.

After the coating step S3 of the resist solution ends, the rotation of the wafer W is decelerated to a sixth speed V6, for example, of about 200 rpm as shown in FIG. 7, whereby the resist solution on the wafer W is evened out and flattened (a flattening step S4 in FIG. 6 and FIG. 7 (a second step in the present disclosure)).

After the flattening step S4 ends, the rotation of the wafer W is accelerated to a seventh speed V7, for example, of about 1500 rpm as shown in FIG. 7, whereby the resist solution on the wafer W is dried (a drying step S5 in FIG. 6 and FIG. 7 (a third step in the present disclosure)). In this manner, a thin resist film is formed on the wafer W.

After the drying of the wafer W ends, the rotation of the wafer W is stopped, and the wafer W is transferred out from the top of the spin chuck 130, with which a series of resist coating treatment ends.

After the resist coating treatment, the wafer W is transferred by the first transfer unit 20, for example, to the prebaking unit 71 and subjected to pre-baking. Subsequently, the wafer W is transferred by the second transfer unit 21 to the edge exposure unit 92 and the temperature regulating unit 83 in sequence, and subjected to predetermined processing in each of the units. The wafer W is then transferred by the wafer transfer unit 101 in the interface station 5 to the aligner 4 and subjected to liquid-immersion exposure. The wafer W is then transferred by the wafer transfer unit 101, for example, to the post-exposure baking unit 84 and subjected to post-exposure baking, and then transferred by the second transfer unit 21 to the temperature regulating unit 81 and temperature-regulated. The wafer W is then transferred to the developing treatment unit 40 in which the resist film on the wafer W is developed. After development, the wafer W is transferred by the second transfer unit 21 to the post-baking unit 75 and subjected to post-baking. The wafer W is then transferred to the temperature regulating unit 63 and temperature-regulated. The wafer W is then transferred by the first transfer unit 20 to the transition unit 61 and returned by the wafer transfer unit 12 to the cassette C, with which a series of wafer processing ends.

According to the above embodiment, since the wafer W is acceleratingly rotated at all times in the coating step S3, the resist solution can be rapidly diffused, and the coating amount for diffusing the resist solution over the entire surface of the wafer W can be suppressed to a small amount. Further, since the rotation speed of the wafer W is low immediately after the resist solution is discharged to the central portion of the wafer W in the step S3-1, strong centrifugal force is not applied to the resist solution on the wafer W. In addition, since the acceleration of the rotation of the wafer W in this event is the first acceleration lower than the second acceleration, the centrifugal force applied to the resist solution on the wafer W can be suppressed. Therefore, the resist solution can be diffused outward evenly without appearance of the coating mottle on the wafer as in the prior art. Thereafter, since the wafer W is acceleratingly rotated in a step S3-2 at the second acceleration higher than the first acceleration, the resist solution on the wafer W can be smoothly and rapidly diffused. Thereafter, since the wafer W is acceleratingly rotated in the step S3-3 at the third acceleration lower than the second acceleration, the amount of the resist solution scattering to the outside of the wafer W can be suppressed to a minute amount while the resist solution reached the outer peripheral portion of the wafer W is smoothly diffused. Consequently, according to this embodiment, even when the coating amount of the resist solution is small, the resist solution can be uniformly applied. This makes it possible to form on the wafer W a coating film thinner than that in the prior art. Further, the cost required for the coating treatment can also be reduced.

Though the first acceleration of the rotation of the wafer W in the step S3-1 is the same as the third acceleration of the rotation of the wafer W in the step S3-3 in the above embodiment, the third acceleration may be higher than the first acceleration. As this case, for example, a case in which, for example, the first acceleration is 100 rpm/s and the third acceleration is 200 rpm/s can be exemplified. Since the first acceleration is low as described above, the centrifugal force applied to the resist solution on the wafer W can be made smaller in the step S3-1 so that the resist solution can be more surely evenly diffused outward. Further, since the third acceleration is higher than the first acceleration, the resist solution reached the outer peripheral portion of the wafer W can be smoothly and rapidly diffused in the step S3-3. Consequently, according to this embodiment, the coating mottle on the wafer in the prior art can be surely avoided, and the resist solution can be uniformly applied over the wafer W.

Figure 8:
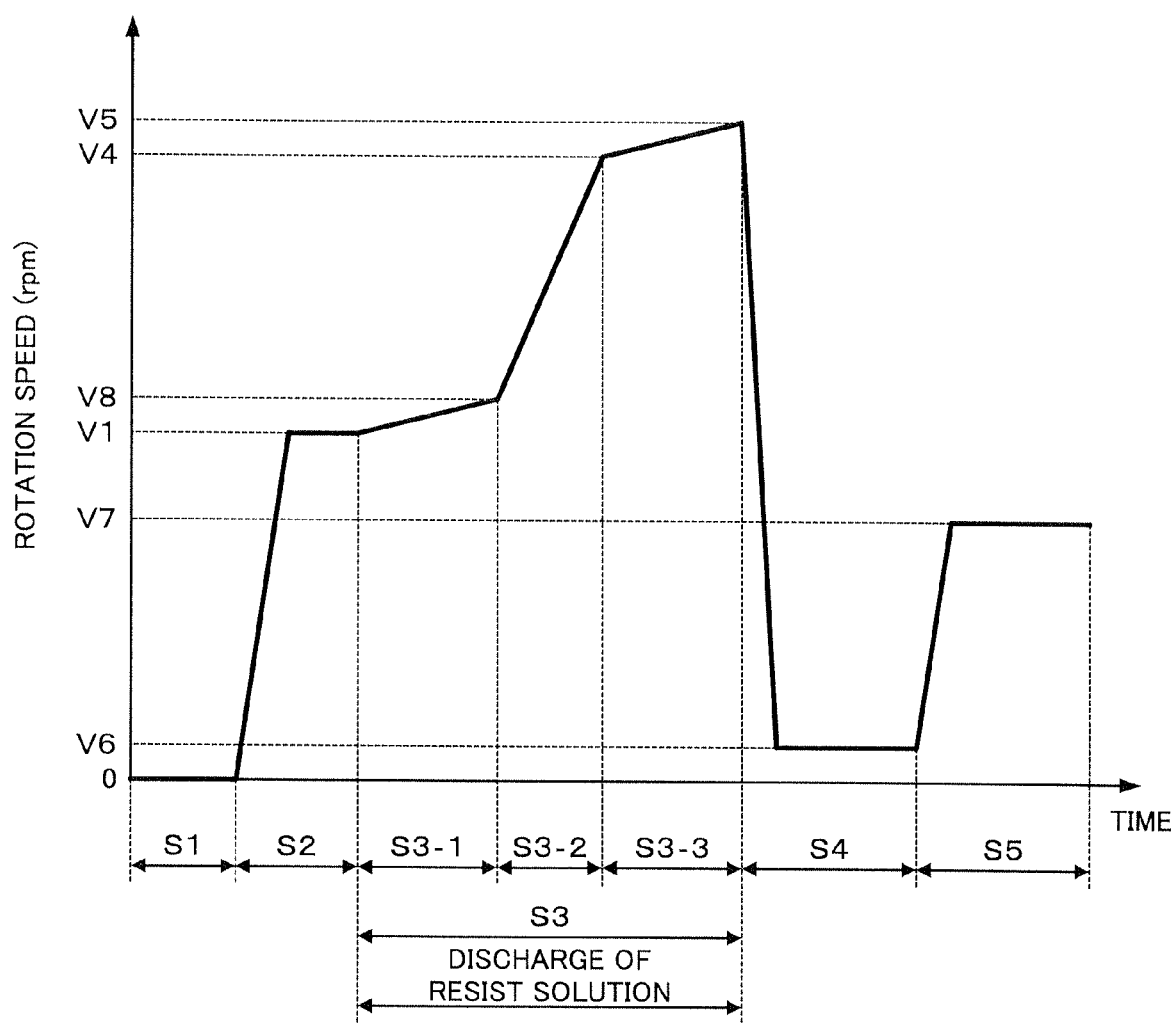
FIG. 8 is a graph showing the rotation speed the wafer and the discharge timing of the resist solution in each of the steps of the resist coating treatment according to another embodiment.

Though the solvent is applied over the surface of the wafer W while the wafer W is rotated at the first speed V1 and then the rotation of the wafer W is decelerated to the second speed V2 in the solvent diffusion step S2 in the above embodiment, the coating step S3 may be started without decelerating the rotation of the wafer W as shown in FIG. 8. In this case, the coating step S3 is started with the rotation of the wafer W kept at the first speed V1, for example, of about 2000 rpm.

In the coating step S3, the rotation of the wafer W is first accelerated from the first speed V1 to an eighth speed V8, for example, of about 2200 rpm (a step S3-1 in FIG. 8). In the step S3-1, the acceleration of the rotation of the wafer is the first acceleration, for example, of 500 rpm/s or lower, more preferably, 100 rpm/s as in the above embodiment. Subsequently, the rotation of the wafer W is accelerated from the eighth speed V8 to the fourth speed V4, for example, of about 3800 rpm (a step S3-2 in FIG. 8). In the step S3-2, the acceleration of the rotation of the wafer is the second acceleration, for example, of 5000 rpm/s to 30000 rpm/s, more preferably, 10000 rpm/s higher than the first acceleration. Subsequently, the rotation of the wafer W is accelerated from the fourth speed V4 to the fifth speed V5, for example, of about 4000 rpm (a step S3-3 in FIG. 8). In the step S3-3, the acceleration of the rotation of the wafer is the third acceleration, for example, of 500 rpm/s or lower, more preferably, 200 rpm/s lower than the second acceleration.

As described above, in the coating step S3, the acceleration of the rotation of the wafer W is varied in the order of the first acceleration, the second acceleration and the third acceleration, and the wafer W is acceleratingly rotated at all times. Further, in the coating step S3, the resist solution is kept supplied to the central portion of the wafer W. This diffuses the supplied resist solution over the entire surface of the wafer W by the centrifugal force and thereby applies the resist solution over the surface of the wafer W.

Thereafter, the wafer W is subjected to the resist solution flattening step S4 and the resist solution drying step S5. Note that the flattening step S4 and the drying step S5 in this embodiment are performed respectively with the same recipes as those of the flattening step S4 and the drying step S5 in the above embodiment, and therefore the description thereof is omitted.

According to this embodiment, since the solvent is applied over the surface of the wafer W in the solvent diffusion step S2 and then the coating step S3 is started without decelerating the rotation of the wafer W, the rotation of the wafer W in the coating step S3 is kept at a relatively high speed as compared to that in the above embodiment. Therefore, a relatively high centrifugal force acts on the coating solution on the wafer and thereby can further improve the uniformity of the film thickness of the resist solution within the wafer.

Here, avoiding the coating mottle of the resist solution on the wafer W, namely, the covering property of the resist solution and the uniformity of the film thickness of the resist solution within the wafer are in a tradeoff relation. Therefore, when placing importance on the covering property of the resist solution, it is preferable to apply the resist solution by the method of the embodiment shown in FIG. 7. On the other hand, when a sufficient covering property of the resist solution is ensured and the uniformity of the film thickness of the resist solution within the wafer is desired to be ensured, it is preferable to apply the resist solution by the embodiment shown in FIG. 8.

Further, since the acceleration of the rotation of the wafer W is varied in the order of the first acceleration, the second acceleration and the third acceleration and the wafer W is acceleratingly rotated at all times in the coating step S3 also in this embodiment, the resist solution is smoothly and rapidly diffused over the surface of the wafer W.

Figure 9:
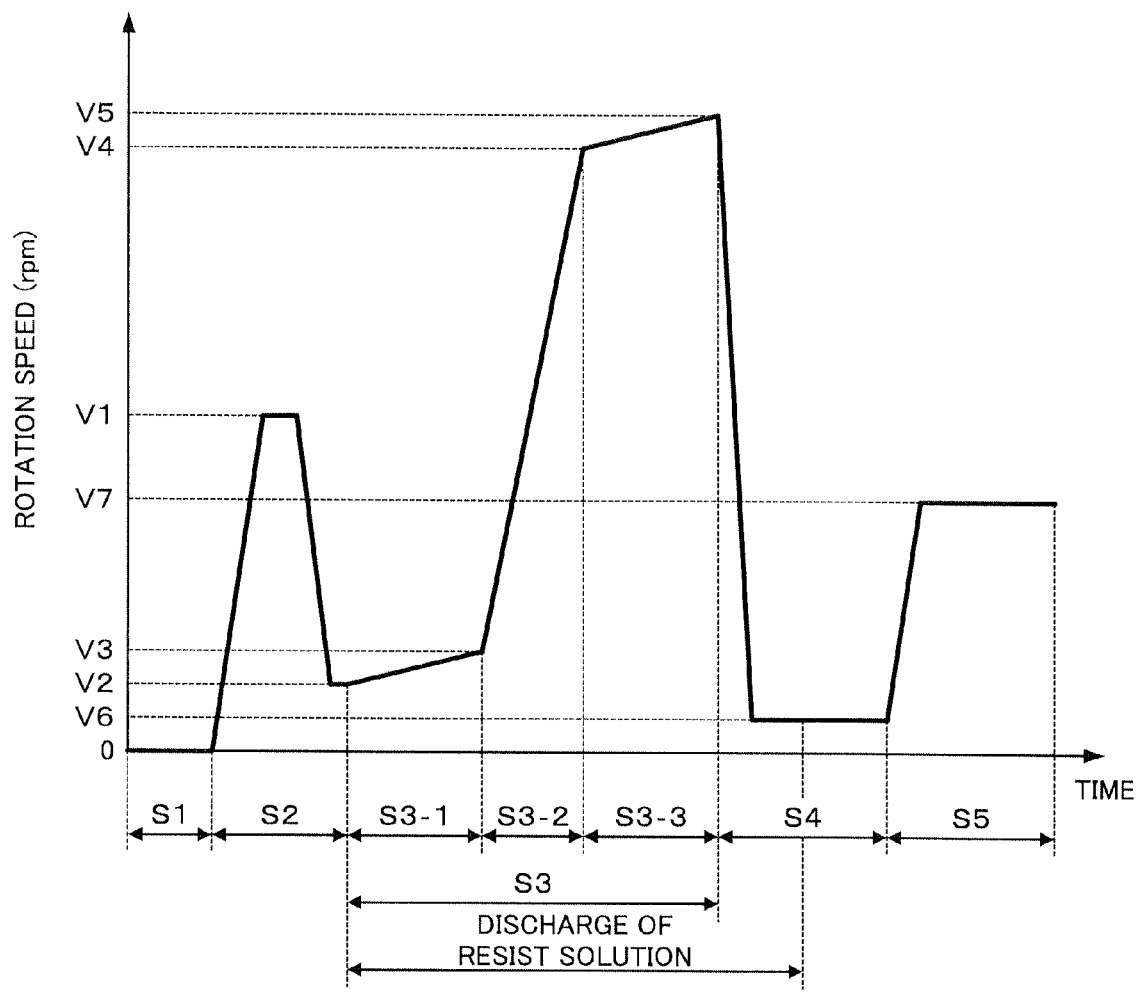
FIG. 9 is a graph showing the rotation speed of the wafer and the discharge timing of the resist solution in each of the steps of the resist coating treatment according to another embodiment.

In this embodiment, the discharge of the resist solution by the first nozzle 143 in the coating step S3 may be continuously performed to a middle of the flattening step S4 as shown in FIG. 9. In this case, since the rotation of the wafer W is low in the flattening step S4, the resist solution discharged in the flattening step S4 can improve the flowability of the resist solution on the wafer W while suppressing the drying of the resist solution on the wafer W. Accordingly, the film thickness of the resist solution on the wafer W can be made more uniform.

Further, in this case, at the time when the discharge of the resist solution by the first nozzle 143 in the coating step S3 is ended, the first nozzle 143 may be moved to displace the discharge position of the resist solution from the central portion of the wafer W.

Figure 10:
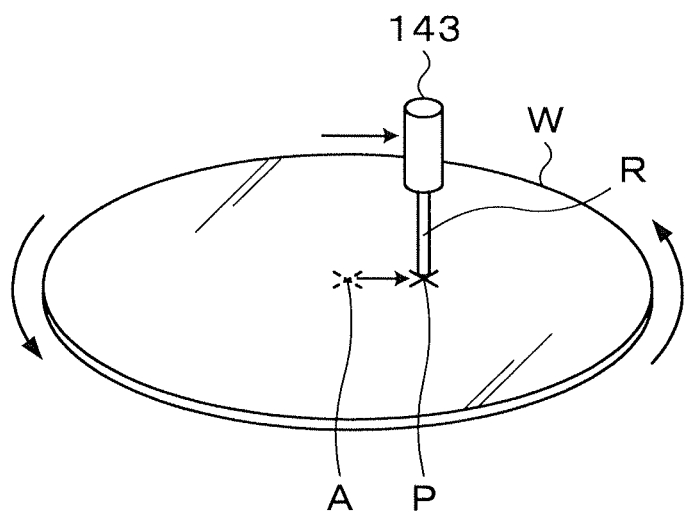
FIG. 10 is an explanatory view showing the state that a first nozzle is moved to displace the discharge position of the resist solution from a central portion of the wafer.

For example, concurrently with the end of the coating step S3, the first nozzle 143 is moved from the position above a central portion A of the wafer W in the direction of the diameter of the wafer W by, for example, 3 mm or more, more preferably, about 5 to 30 mm while continuously discharging the resist solution R as shown in FIG. 10. Thus, a discharge position P of the resist solution on the surface of the wafer W is displaced from the central portion A. Note that the rotation speed of the wafer W in this event is changed to a low speed, the sixth speed V6 of about 200 rpm. The first nozzle 143 is stopped at a position displaced by a predetermined distance from the position above the central portion A of the wafer W, and the valve 148 is closed to stop the discharge of the resist solution at this moment. Thereafter, the wafer W is continuously rotated at the sixth speed V6, whereby the resist solution on the wafer W is evened out and flattened. In other words, the discharge of the resist solution is performed from the resist solution coating step S3 to the middle of the resist solution flattening step S4, and at the time when the discharge of the resist solution ends in the flattening step S4, the first nozzle 143 is moved to displace the discharge position P of the resist solution from the central portion A of the wafer W.

According to this embodiment, since the resist solution at the draining of the solution from the first nozzle 143 drops on the wafer W rotated at a low speed in the flattening step S4, the rapid drying of the resist solution is prevented. In addition, the resist solution drops at the position P displaced from the central portion A of the wafer W and therefore can be appropriately diffused within the wafer by the centrifugal force stronger than that at the central portion of the wafer W. As a result, even when an unstable amount or shape of the resist solution at the end of discharge from the first nozzle 143 is discharged, no coating mottle is formed near the central portion A of the wafer W, so that even when a small amount of resist solution is used, a uniform resist film can finally be formed on the entire surface of the wafer W.

Though the movement start timing of the first nozzle 143 is at the same time with the end of the coating step S3 in the above embodiment, the movement start timing may be before the end of the coating step S3. This configuration makes it possible to end the movement of the first nozzle 143 at an earlier stage and end the discharge of the resist solution at an accordingly earlier stage during the flattening step S4. As a result of this, the amount of resist solution used in the whole process can be reduced so that the cost can be reduced. Note that the movement of the first nozzle 143 is more preferably started after 50% or more of the coating step S3 is ended in consideration of the diffusion of the resist solution over the entire wafer surface.

Figure 11:
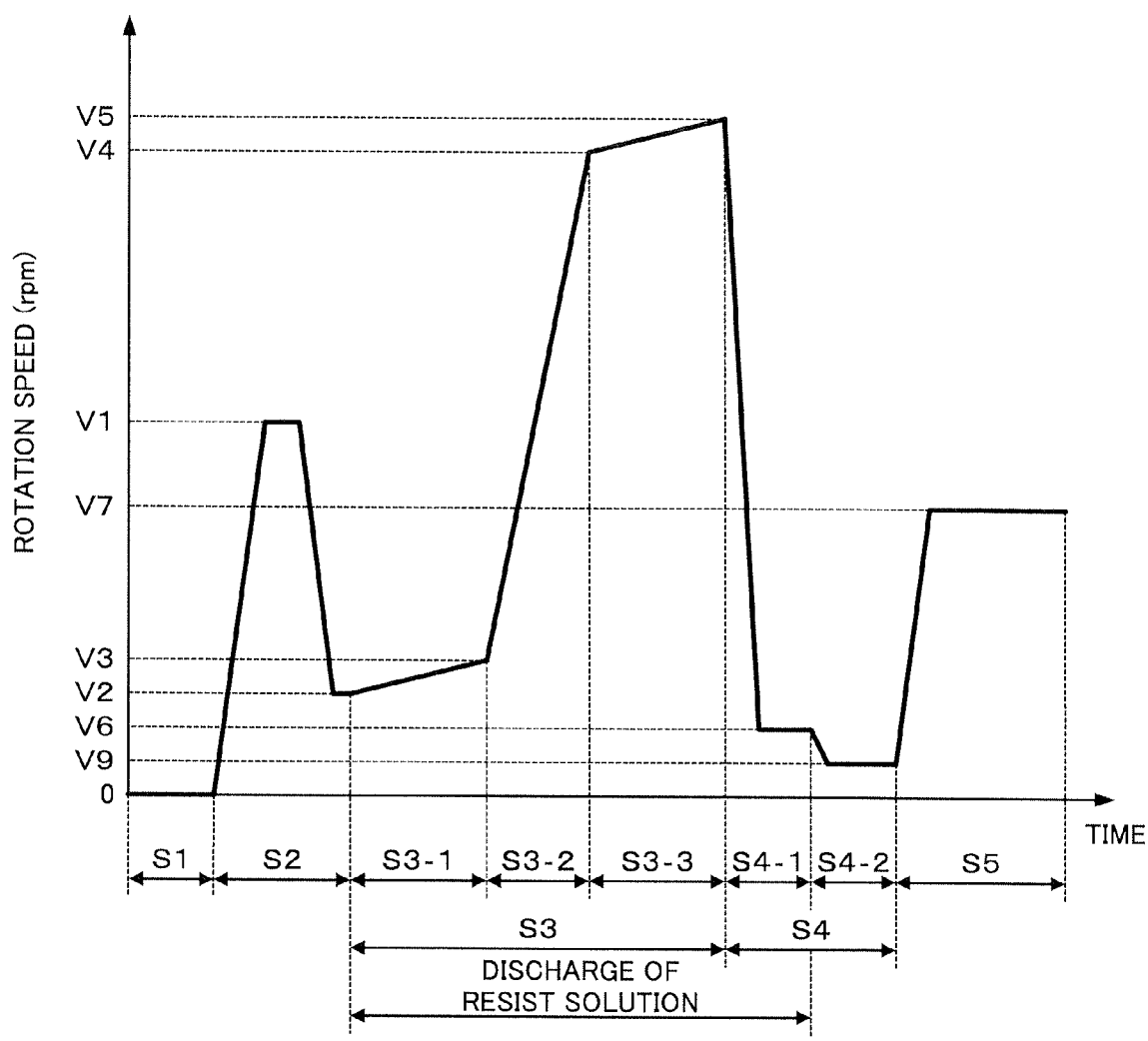
FIG. 11 is a graph showing the rotation speed of the wafer and the discharge timing of the resist solution in each of the steps of the resist coating treatment according to another embodiment.

In the flattening step S4 of the above embodiment, after the discharge of the resist solution by the first nozzle 143 is performed until the middle of the flattening step S4 and the discharge of the resist solution is stopped, the rotation of the wafer W may be decelerated and the wafer W may be continuously rotated as shown in FIG. 11. In this case, in the flattening step S4, the resist solution is discharged while the wafer W is being rotated at the sixth speed V6 (a step S4-1 in FIG. 11). Subsequently, immediately after the discharge of the resist solution is stopped, the rotation of the wafer W is decelerated to a ninth speed V9, for example, of 10 rpm to 50 rpm, more preferably, 10 rpm, and the wafer W is continuously rotated at the ninth speed V9 (a step S4-2 in FIG. 11). Note that the other solvent discharge step S1, the solvent diffusion step S2, the coating step S3 and the drying step S5 are performed respectively with the same recipes as those of the steps S1, S2, S3, S5 of the above embodiment, and therefore the description thereof in omitted.

When a resist solution with a high surface tension, for example, a resist solution containing a solvent such as cyclohexanone or the like is used as the resist solution here, there occurs a problem a so-called draining of the solution that spherical droplets of the resist solution drop from the first nozzle 143 at the end of the discharge of the resist solution. In this case, the solution droplets of the resist solution ruffle the resist solution applied on the wafer W and disturb the surface of the resist solution. This generates the coating mottles on the wafer W, failing to apply the resist solution uniformly within the wafer.

In this regard, according to the above embodiment, since the rotation of the wafer W is decelerated to the ninth speed V9 in the step S4-2 immediately after the discharge of the resist solution is stopped in the step S4-1, the diffusion of the resist solution on the wafer W can be suppressed in the step S4-2. Thus, even when the droplets of the resist solution drop from the first nozzle 143 at the end of the discharge of the resist solution as described above, the disturbance of the surface of the resist solution on the wafer W can be decreased to suppress the coating mottles on the wafer W. Therefore, the uniformity of the film thickness of the resist solution within the wafer can be further improved.

Though the drying step S5 is performed in a fixed period set in advance in the above embodiment, the film thickness of the resist solution on the wafer W may be continuously detected by a sensor during at least the drying step S5 and the drying may be stopped at the moment when the film thickness does not vary any longer. It has been verified that once the resist solution dries, the variation in the film thickness converges and becomes fixed. Therefore, the end point of the drying can be accurately grasped by this method. Further, in this case, since the drying time can be individually managed, for example, depending on the kind of the resist solution and the rotation speed during the drying of the wafer W, the drying time does not need to be set relatively longer, unlike the prior art, and the wafer processing can be advanced to the next step faster. As a result, the throughput of the wafer processing can be improved.

Preferred embodiments of the present disclosure have been described above with reference to the accompanying drawings, but the present disclosure is not limited to the embodiments. It should be understood that various changes and modifications are readily apparent to those skilled in the art within the scope of the technical spirit as set forth in claims, and those should also be covered by the technical scope of the present disclosure.

For example, while the above-described embodiments have been described taking the coating treatment of the resist solution as an example, the present disclosure is also applicable to the coating treatment of a coating solution other than the resist solution, for example, a coating solution for forming an anti-reflection film, an SOG (Spin On Glass) film, an SOD (Spin On Dielectric) film or the like. Further, the above embodiments are examples of performing the coating treatment on the wafer W, and the present disclosure is also applicable to a coating treatment on other substrates other than the wafer, for example, an FPD (Flat Panel Display), a mask reticle for a photomask, and the like.

What is claimed is:

1. A coating treatment method of a substrate, comprising:
   a first step of discharging a coating solution from a nozzle to a central portion of a substrate, while applying the coating solution over the substrate, continuously rotating the substrate and accelerating the rotating of the substrate at three separate and distinct constant accelerations in an order of a first constant acceleration, a second constant acceleration higher than the first constant acceleration, and a third constant acceleration lower than the second constant acceleration,
   a second step of decelerating the rotation of the substrate while continuously rotating the substrate; continuing the discharge of the coating solution by the nozzle from the first step until a middle of the second step; and after the discharging of the coating solution is stopped in the middle of the second step, continuously rotating the substrate and decelerating the rotation of the substrate; and
   a third step of accelerating the rotation of the substrate and drying the coating solution on the substrate.

2. The coating treatment method as set forth in claim 1, further comprising:
   before the first step, a fourth step of supplying a solvent for the coating solution to the substrate to apply the solvent over the substrate while rotating the substrate,
   wherein the first step is started with a rotation speed of the substrate in the fourth step maintained.

3. A non-transitory computer-readable storage medium storing a program running on a computer of a control unit controlling a coating treatment apparatus to cause the coating treatment apparatus to perform a coating treatment method, the coating treatment method comprising:
   a first step of discharging a coating solution from a nozzle to a central portion of a substrate, while applying the coating solution over the substrate, continuously rotating the substrate and accelerating the rotating of the substrate at three separate and distinct constant accelerations in an order of a first constant acceleration, a second constant acceleration higher than the first constant acceleration, and a third constant acceleration lower than the second constant acceleration,
   a second step of decelerating the rotation of the substrate while continuously rotating the substrate; continuing the discharge of the coating solution by the nozzle from the first step until a middle of the second step; and after the discharging of the coating solution is stopped in the middle of the second step, continuously rotating the substrate and decelerating the rotation of the substrate; and
   a third step of accelerating the rotation of the substrate and drying the coating solution on the substrate.

4. The non-transitory computer-readable storage medium storing a program running on a computer of a control unit controlling a coating treatment apparatus to cause the coating treatment apparatus to perform a coating treatment method according to claim 3, the coating treatment method further comprising:
   before the first step, a fourth step of supplying a solvent for the coating solution to the substrate to apply the solvent over the substrate while rotating the substrate,
   wherein the first step is started with a rotation speed of the substrate in the fourth step maintained.

* * * * *